United States Patent [19]

Ciszek et al.

[11] Patent Number: 5,544,616
[45] Date of Patent: Aug. 13, 1996

[54] CRYSTALLIZATION FROM HIGH TEMPERATURE SOLUTIONS OF SI IN CU/AL SOLVENT

[75] Inventors: Theodore F. Ciszek, Evergreen; Tihu Wang, Golden, both of Colo.

[73] Assignee: Midwest Research Institute, Kansas City, Mo.

[21] Appl. No.: 249,957

[22] Filed: May 27, 1994

Related U.S. Application Data

[63] Continuation-in-part of Ser. No. 881,416, May 13, 1992, Pat. No. 5,314,571.

[51] Int. Cl.[6] .................................................. C30B 19/02
[52] U.S. Cl. ............................ 117/60; 117/64; 117/67; 117/934
[58] Field of Search ........................ 117/60, 64, 67, 117/934

[56] References Cited

U.S. PATENT DOCUMENTS

| | | | |
|---|---|---|---|
| 2,990,372 | 6/1961 | Pinter et al. | |
| 3,597,171 | 8/1971 | Knippenberg et al. | 117/934 |
| 3,897,281 | 7/1975 | Gilbert et al. | 117/64 |
| 4,088,514 | 5/1978 | Hara et al. | |
| 4,201,623 | 5/1980 | Sumner. | |
| 4,772,564 | 9/1988 | Barnett et al. | 437/4 |
| 4,778,478 | 9/1988 | Barnett | 437/5 |
| 4,822,585 | 4/1989 | Dawless. | |

OTHER PUBLICATIONS

Ciszek et al, "Si Thin Layer Growth From Metal Solution on Single-Crystal and Cast . . . ", Twenty third IEEE Photovoltaic Specialists Con 1993 pp. 65–72 abs only.

*Primary Examiner*—Robert Kunemund
*Attorney, Agent, or Firm*—Edna M. O'Connor

[57] ABSTRACT

A liquid phase epitaxy method for forming thin crystalline layers of device quality silicon having less than $3\times10^{16}$ Cu atoms/cc impurity, comprising: preparing a saturated liquid solution of Si in a Cu/Al solvent at about 20 to about 40 at. % Si at a temperature range of about 850° to about 1100° C. in an inert gas; immersing or partially immersing a substrate in the saturated liquid solution; super saturating the solution by lowering the temperature of the saturated solution; holding the substrate in the saturated solution for a period of time sufficient to cause Si to precipitate out of solution and form a crystalline layer of Si on the substrate; and withdrawing the substrate from the solution.

6 Claims, 3 Drawing Sheets

TO VACUUM OR ARGON INLET

TO VACUUM OR ARGON INLET

CRYSTALLIZATION FROM HIGH TEMPERATURE SOLUTIONS OF SI IN CU/AL SOLVENT

The United States Government has rights in this invention pursuant to Contract No. De-ACO2-83CH10093 between the United States Department of Energy and the Midwest Research Institute.

BACKGROUND OF THE INVENTION

1. Field of the Invention

The invention is a continuation-in-part of U.S. patent application Ser. No. 07/881,416, filed May 13, 1992, now U.S. Pat. No. 5,314,571 and incorporates by reference in its entirety, the foregoing patent application. The application relates generally to a method for forming thin liquid phase epitaxy (LPE) crystalline layers of device quality silicon having less than $3 \times 10^{16}$ Cu atoms/cc impurity, and is accomplished by: providing a saturated solution of Si in Cu/Al solvent at about 920° C.; immersing a silicon substrate in the saturated solution; ramping or lowering the temperature down at a rate of about 0.05°–0.2° C./minute; holding the substrate in the saturated solution for a period of time sufficient to cause Si to precipitate out of the solution to form a crystalline layer of Si on the substrate; and withdrawing the substrate from the solution.

Growing ingots, wafering, and thin-polishing is not cost effective in providing thin silicon layers and the wafers are fragile to handle. Ribbons of silicon are difficult to grow in such thin geometries and the ribbons are also fragile. On the other hand, growing thin layers on a substrate from the Si melt requires high temperatures and hence high energy input. Furthermore, due to the surface tension of Si, thin flat layers can only be grown on substrates which the silicon wets well, such as graphite; however, this can introduce impurity problems. Moreover, the substrates must be able to withstand a temperature of 1430° C. and small Si grain sizes generally result.

Chemical vapor deposition (CVD) is in wide spread use to grow epitaxial layers of silicon on silicon substrates to provide desired properties or device structures in microelectronics. This process is carried out at around 1200° C. by reduction of silicon-containing gas phases. However, due to the complexity of the gas system, slow growth rate, plasma vacuum and the high temperatures used, the operation is expensive and susceptible to contamination by impurities. Moreover, sputtering deposition techniques generally result in too small grain sizes.

The LPE technique is simple in system design and easy to operate, and the potential for low cost and relatively low temperature operation (a few hundred to about 1000° C.) is especially appealing to the photovoltaic industry where a low cost approach to grow high quality, thin layer silicon on low grade silicon substrates can significantly lower the cost of photovoltaic solar cells if solvent impurities can be adequately avoided.

While solvents such as tin, tin-lead, or indium have been used to grow silicon layers on expensive, (111)-oriented, single crystal silicon substrates, difficulties have arisen with other orientations since (111) is the plane in silicon having the highest ratio of lateral to vertical growth rate, that causes anisotropic growth behavior for growth on multicrystalline silicon substrates. Since this is more difficult than single crystals, no significant successes have been reported in obtaining high quality layers deposited on low cost, multicrystalline silicon substrates.

In U.S. patent application Ser. No. 07/881,416, copper was used as a solvent to grow silicon layers with the attendant advantages of high solvent power, low copper solubility in silicon and high impurity retaining capability by the copper melt. However, in a simple LPE apparatus where no in-situ surface cleaning procedure is available, unless the surface is first dissolved by the solvent, the fast-forming, omnipresent native oxides on silicon substrate surfaces can prevent good wetting between the solution and the substrate. The poor wetting results in low nucleation density and rough grown surfaces comprising (111)-terminated facets with adhered solvent-solute alloys trapped in troughs that often cause incomplete coverage of growth and breakage/strain due to thermal stress. Dissolving the substrate surface during the initial growth step will improve wetting, but it does not serve the purpose of growing a high quality layer over a low quality substrate, since excessive impurities will enter into the growth solution (especially from grain boundaries where impurities are concentrated and dissolve faster, and subsequently incorporate into the grown layer).

Therefore, a need exists in the art of forming thin crystalline layers of silicon by liquid phase epitaxy to provide growth of smooth silicon layers on silicon substrates of any orientation without the need to first partially dissolve the substrate, so that high quality silicon layers can be formed even on low-grade multicrystalline silicon substrates.

Epitaxial growth of Si on a substrate from a gas phase by chemical vapor deposition (CVD) is uneconomical because of slow growth rates and plasma vacuum, and sputtering deposition techniques generally result in too small grain sizes.

Therefore, liquid phase epitaxial growth of Si is more suitable, if solvent impurities can be adequately avoided.

2. Prior Art

U.S. Pat. No. 4,201,623 discloses a crystal substrate of <111> silicon doped by exposure to a liquid metal solvent, wherein the substrate is carried in a cavity in a refractory boat, and the solvent is carried in a perforation of a cover for the boat; said boat being heated to a certain temperature in a non-oxidizing atmosphere and moved to place the substrate cavity under the cover perforation so that the solvent and substrate come into contact.

A process for growing thin epitaxial layers of Group III–V semiconductor materials is described in U.S. Pat. No. 4,088,514. The process prepares a saturated solution of the semiconductor materials in a metal melt by keeping an undersaturated solution in contact with the crystalline semiconductor material at a predetermined temperature, supercooling the saturated solution and bringing the supercooled solution into contact with a substrate.

U.S. Pat. No. 2,990,372 describes a process for producing silicon of high purity by dissolving silicon in a metal and crystallizing the silicon therefrom. The silicon is dissolved at a temperature in the range of about 700°–1200° C. in a metallic melt used in an amount sufficient for dissolution of the silicon and suitable for crystallization of the silicon upon cooling, wherein the metal melt is of a melt-forming metal and alloys of these metals; including in the melt a dope for the silicon semiconductor; slowly reducing the temperature of the melt including the silicon and dope in order to effect crystallization of the silicon; and separating the crystallized dope-containing silicon by dissolving the non-silicon ingredients of the solidified melt in an acid, the melt-forming metal of the metallic melt-silicon solution being present as the principal component of the solution based on the metal-forming metal and silicon content of the solution.

A method of purifying silicon is disclosed in U.S. Pat. No. 4,822,585 which comprises: providing a molten body of a silicon material in a solvent metal of copper; extracting heat from the body to provide a solid phase containing silicon in crystal form and to concentrate impurities in a molten phase; removing a substantial part of the molten phase from the solid phase containing the silicon crystals; subjecting the solid phase to a melting action to melt at least a fraction of the solid phase for purposes of removing a substantial amount of copper-silicon combination adhering to the crystals; and separating at least a fraction of the melted material from the crystals of silicon.

In prior art processes for forming crystalline silicon, there is the requirement of holding the Si melt at relatively high temperatures and this occasions high-power requirements and the higher costs associated therewith. Moreover, in prior art processes for forming crystalline silicon that involve silicon solvents of Ga or In, these processes have suffered from a lack of control over the levels of particular dopant that is desired to be incorporated in the crystalline silicon product.

Liquid phase epitaxy (LPE) is also sometimes called high-temperature solution growth or metal solution growth (if the solvent is a metal), and it has been used since the 1960's in the semiconductor industry for group III–V growth (GaAs, GaP, etc.). Thin layer silicon epitaxy has also been heavily investigated using the solvents of group III (Al, Ga, In); group V (Sb, Bi); group IV (Sn); and the metals Au, Cd, Pb, and Ag.

However, a problem with group III and V solvents is that they are also electrical dopants for silicon, and usually lead to difficulties with dopant control. Many metals degrade the minority charge carrier lifetime of the silicon, which is detrimental for most applications. These problems arise because there is some solubility of the solvent element in the grown silicon layer, and this varies with the particular solvent.

A problem with some solvents is that they do not dissolve much silicon and this can lead to excessively slow growth rates.

In the early 1980's, Olson, Carleton, and Tejedor showed the advantageous property of solid Cu-Si alloys to preferentially retain impurities, and used them as source material for bulk polycrystalline Si formation via chemical vapor deposition and electrodeposition of silicon. They were able to refine silicon by both electrodeposition (J. M. Olson and K. L. Carleton, J. Electro. Chem. So. 128 No. 12 (1981) 2699) and by chemical vapor deposition (P. Tejedor and J. M. Olson, J. of Crystal Growth 89 (1988) 220). They were also able to achieve bulk silicon with typically less than 5 ppm impurity compared to their silicon starting material which contained about 1% impurity.

In U.S. Pat. No. 4,822,585 Cu solvent was used to advantage in a liquid phase purification process for bulk silicon.

Therefore, a need exists to provide a method for producing thin crystalline layers of device quality silicon faster, at lower process temperatures, with improved control of the dopant content, and without first partially dissolving the substrate, as is the case when using Cu alone as the solvent.

The method of the present invention entails utilizing LPE by using an improved solvent of Cu/Al as a solvent to:

(1) grow smooth silicon layers on silicon substrates of any orientation;

(2) improve wetting between the substrate and the growth solution without first partially dissolving the substrate (improvement over Cu alone as solvent in previously filed U.S. patent application Ser. No. 07/881,416);

(3) retain impurities in the solution from possible contaminations;

(4) obtain proper doping in the silicon layers (unlike when using Al alone as solvent);

(5) facilitate easy removal of residual solvent by wet chemical etching;

(6) grow thin layer silicon on low grade multi-crystalline silicon substrates for low cost photovoltaic solar cells.

SUMMARY OF THE INVENTION

It is an object of the invention to provide a method for producing thin crystalline layers of device quality silicon at low process temperatures using Cu/Al as a solvent.

Another object of the invention is to provide a method for producing thin crystalline layers of device quality silicon at faster rates and at low process temperatures using Cu/Al as a solvent to grow smooth silicon layers on silicon substrates of any orientation.

A further object still of the invention is to provide a method for producing thin crystalline layers of device quality silicon faster, at low process temperatures using Cu/Al as a solvent to improve wetting between the substrate and the growth solution without first partially dissolving the substrate, as an improvement over using Cu alone as a solvent.

A further object yet still of the invention is to provide a method for producing thin crystalline layers of device quality silicon faster, at low process temperatures using Cu/Al as a solvent to retain impurities in the solution from possible contaminations.

A still further object of the invention is to provide a method for producing thin crystalline layers of device quality silicon faster, at low process temperatures using Cu/Al as a solvent to obtain proper doping in the silicon layers.

Another object of the invention is provide a method for producing thin crystalline layers of device quality silicon faster, at low process temperatures using Cu/Al as a solvent to facilitate easy removal of residual solvent by wet chemical etching.

Another object further still of the invention is to provide a method for producing thin crystalline layers of device quality silicon faster, at low process temperatures using Cu/Al as a solvent to grow thin layer silicon on low grade multicrystalline silicon substrates for low cost photovoltaic solar cells.

In general, the invention method for producing thin crystalline layers of device quality silicon layers using Cu/Al as a solvent is carried out by preparing a saturated liquid solution of Si in a Cu/Al solvent at about 920°; immersing a substrate in the solution; ramping or lowering the temperature down at a rate of about 0.05°–0.2° C./minutes and holding the substrate in the saturated solution for a period of time sufficient to cause Si to precipitate out of the solution to form a crystalline layer of Si on the substrate; and withdrawing the substrate from the solution.

BRIEF DESCRIPTION OF THE DRAWING

The foregoing and additional objects, features and advantages of the present invention will become more apparent to those skilled in the art from consideration of the accompanying detailed description of preferred embodiments thereof, taken in conjunction with the accompanying drawings, in which.

DETAILED DESCRIPTION OF THE PREFERRED EMBODIMENTS

Figure 1:
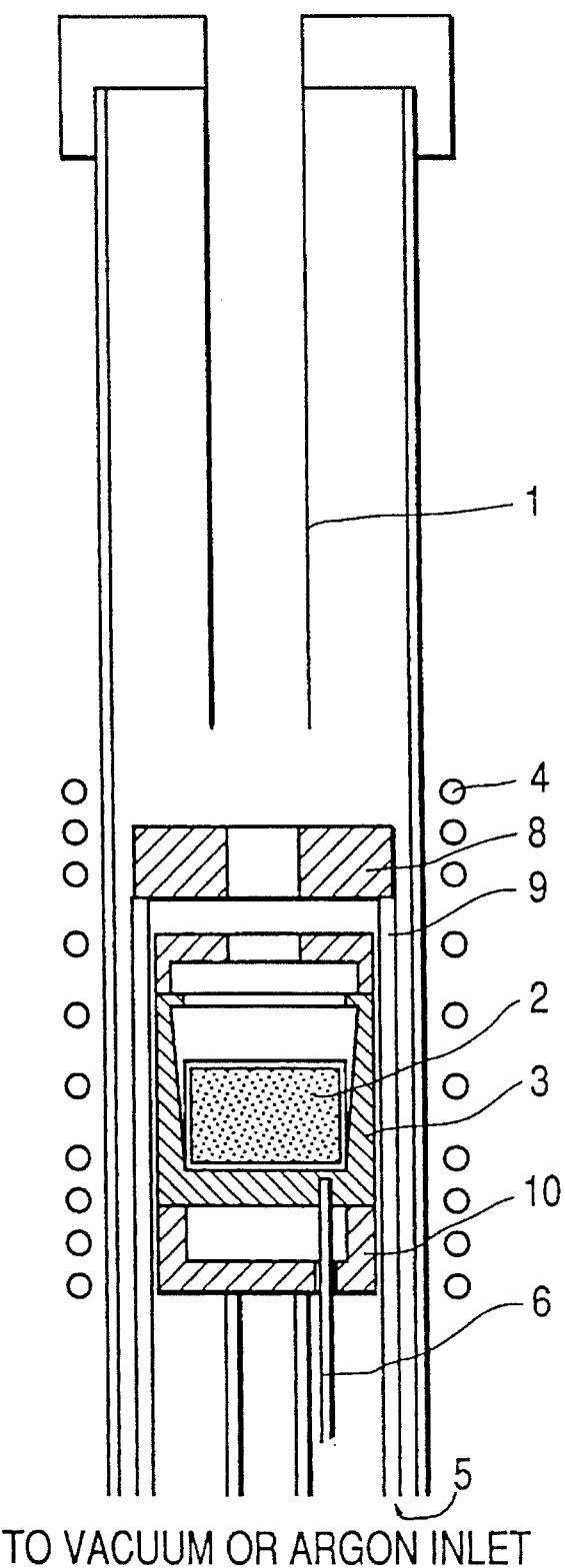
FIG. 1 shows an apparatus for drawing thin crystalline layers of device quality silicon having less than $3\times10^{16}$ Cu atoms/cc impurity.

In referring to FIG. 1, there is shown an apparatus 7 for growing thin crystalline layers of device quality silicon having less than $3\times10^{16}$ Cu atoms/cc impurity. Prior to LPE growth, using the apparatus without the quartz crucible or its contents, the pull port 1 and argon exit was plugged, and the system was evacuated to about $6\times10^{-6}$ torr. The system was baked out at about 1200° C. for several hours. The system was then cooled again.

EXAMPLE

Higher than 99.999% pure aluminum and copper shot, and undoped, electronic grade silicon chunks are used to make the growth solution. A 51-mm-dia quartz crucible 2 was loaded with 108 grams of copper, 8.5 grams of aluminum and 28.5 grams of silicon (i.e., 56.1 at. % Cu, 10.4 at. % Al, and 33.5 at. % Si) after all of the materials were chemically etch-cleaned and vacuum dried. The loaded crucible was then put in a graphite hot zone 3. A cap is shown at 8 in FIG. 1, and insulator at 9. After the charge was heated under vacuum, the vacuum pumps (not shown) were turned off and high-purity argon was admitted into the system through the argon inlet 5. After reaching 2 psi above room temperature pressure the pull port was unplugged to permit the purging argon gas to continuously exit from the pull port or argon exit 1.

In FIG. 1, element 4 is an RF coil for heating, element 6 is a thermocouple used to read the control temperature and element 10 is a graphite support. The hot zone was heated up to 1100° C. to melt the copper and aluminum, and to dissolve the silicon. When no solid silicon remained, the temperature was lowered to around 920° C. A high resistivity silicon wafer was used as a test substrate to find the exact saturation temperature at which neither substrate dissolution nor layer growth happened.

Figure 3:
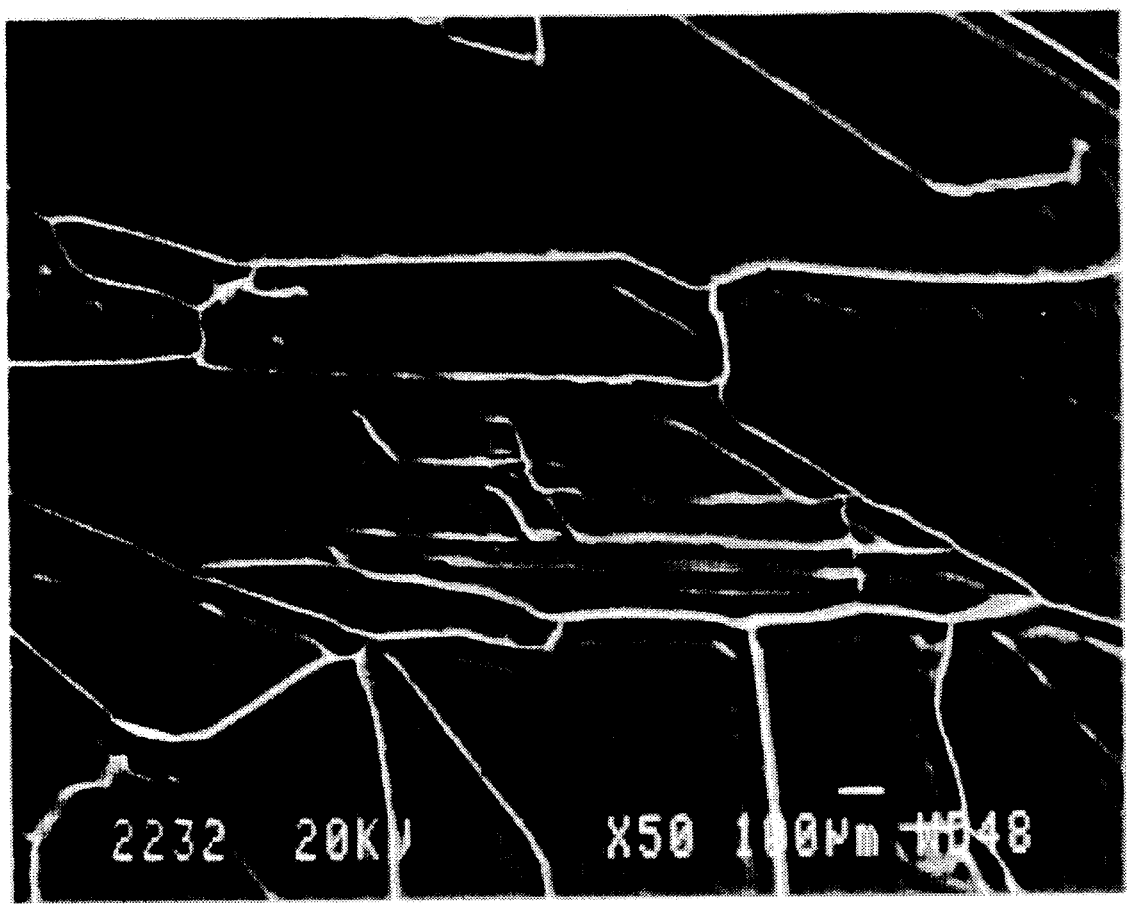
FIG. 3 shows a surface of a silicon layer grown by liquid phase epitaxy (LPE) using Cu/Al as a solvent.

Thereafter, the low-cost, multi-crystalline silicon substrate was held in close proximity to the melt surface for five minutes to allow temperature equilibrium. It was then immersed into the growth solution at the saturation temperature (909.5° C. in this case). After two minutes, the temperature was ramped down at a rate of 0.08° C./min for 40 minutes with a total temperature drop of 3.2° C. The resulting layer is shown in FIG. 3. This layer has a thickness of ~30 μm with little variation in thickness for different grain orientations in the multicrystalline substrate. Solvent residues at the grain boundaries were completely removed by etching in $HCl:HNO_3=3:1$ for four hours. P-type doping from aluminum incorporation resulted in an electrical resistivity of about 0.1 ohm-cm. Secondary ion mass spectroscopy (SIMS) analysis gave the total Al content at $5\times10^{17}$ $cm^{-3}$.

This process is equally employable in a similar fashion using high purity crystalline substrates for electronics industry applications.

The substrates can be left in the air after original chemical cleaning for as long as it is needed. Proper p-type doping from $10^{17}$ cm-3 to $10^{19}$ $cm^{-3}$ of the thin silicon layer is obtained by adjusting the percentage of aluminum used in the solvent. The much improved growth characteristics are believed to be a result of the strong ability of aluminum to strip oxygen off silicon surfaces and the high silicon solute content in the solution.

From the list of electronegativity of related elements as shown:

| silicon | copper | aluminum | tin | indium |
|---------|--------|----------|-----|--------|
| 1.8     | 1.9    | 1.5      | 1.8 | 1.7    | it is clear that aluminum has a much smaller electronegativity than silicon, and that aluminum could substitute silicon in a silicon-oxygen bond. There are other metals having even much smaller values of electronegativity, such as Ca, Mg, etc., but these are known to be detrimental to silicon properties. Cu/Al also has similarly high solvent power to Cu alone at relatively low temperatures compared to tin or indium—thus temperature variation during a given growth is small, thereby ensuring uniform properties of the grown layer. A high solute content also tends to eliminate faceted growth when there are enough nuclei. The high capability to retain impurity in the solution by copper is preserved by the use of Cu/Al if there are contaminations.

In the case of Cu, an initial substrate dissolution step must be used, otherwise the solution adheres to the resulting rough surface and upon cooling the samples are broken apart.

Figure 2:
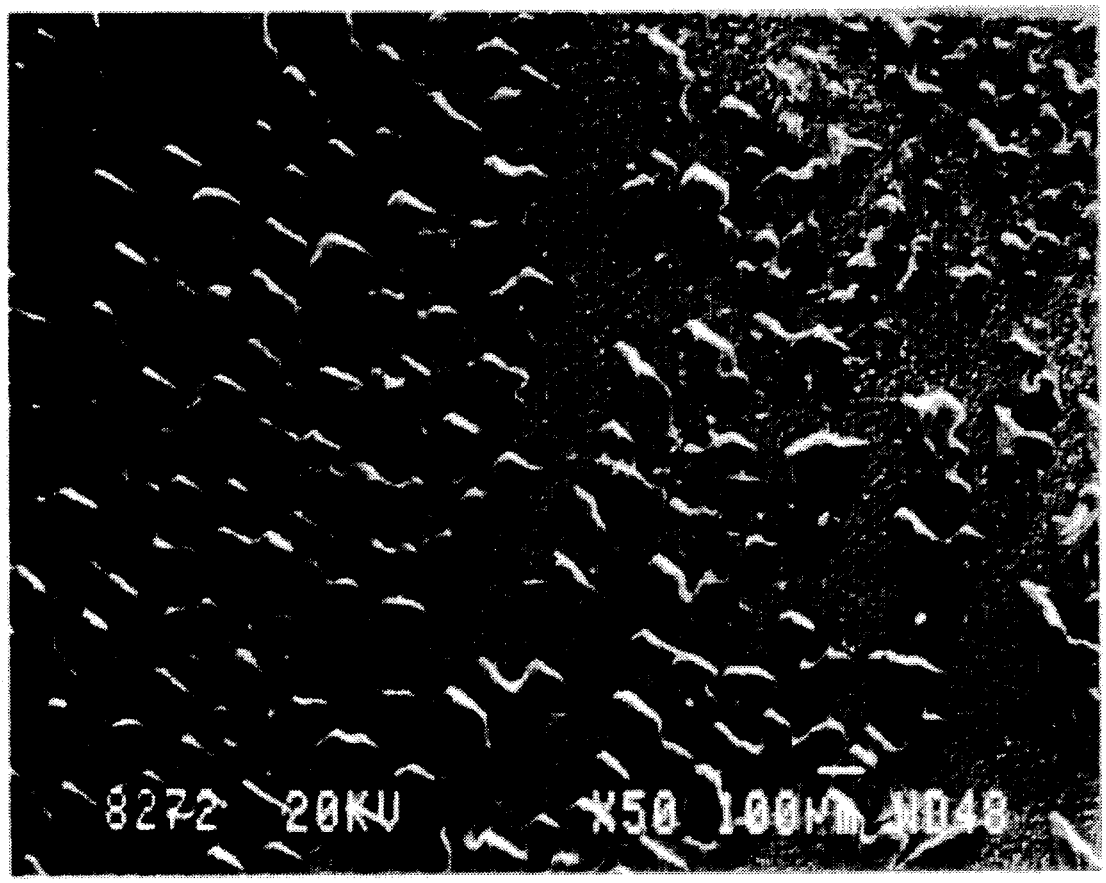
FIG. 2 shows a surface of a silicon layer grown by liquid phase epitaxy (LPE) using Cu/In as a solvent.

Adding indium to copper prevents breakage of the sample after growth, but leaves rough surfaces after etching away the adhered solvent, as shown in FIG. 2. Using indium alone also results in very rough surfaces that are similar to FIG. 2 after etching away the adhered solvent.

FIG. 2 shows a surface of a silicon layer grown by liquid phase epitaxy (LPE) using Cu/In as a solvent.

FIG. 3 shows a surface of a silicon layer grown by liquid phase epitaxy (LPE) using Cu/Al as a solvent.

It was found that Cu/Al as adjustable compositions as a solvent for silicon epitaxial growth exhibited a dramatic improvement in growth characteristics over previously reported solvents. Cu/Al also has use for silicon growth on other substrates such as quartz or glass. The smooth layers grown from solutions of silicon in Cu/Al solvent can be used for many semiconductor devices including photovoltaic solar cells.

Advantages of Cu as a solvent for Si LPE are as follows:

Not detrimental to solar cell performance due to its low solubility in Si;

High solvent power; and

Capability of retarding impurity incorporation into the grown Si layer.

The use of Cu solvent for Si LPE also provides:

Good layer growth on single-crystal Si substrates; and

Demonstrated high solar cell efficiency.

However, even with Cu as a solvent for Si LPE, the following problems with silicon LPE on low-cost (metallurgical grade) Si substrates still exist:

Poor nucleation if the substrate is not partially dissolved to remove native oxide;

Cracking due to solvent adherence because of rough surface;

Contamination if the low grade substrate is partially dissolved; and

Adherence of solvent at the grain boundaries and difficulty of removing the adhered solvent.

Attempts to overcome problems attendant to using copper as a solvent have resulted in the use of Cu/In solvents; however, while Cu/In solvents eliminates cracking, these solvents produce poor nucleation and the low solvent power leads to faceted growth and poor coverage of the Si on the substrate.

Al as a solvent has also been used in an attempt to overcome the disadvantages of Cu as a solvent, and Al improves wetting and nucleation and provides heavy p-type doping of the grown layer by Al ($10^{19}$ atoms/cm$^3$).

In the current invention, the use of the solvent of Cu/Al provides the following advantages:

Maintains the advantages of Cu solvent inclusive of retaining impurities (Al as well as other contaminants) in the melt;

Provides high solvent power for Si;

No solvent adherence due to smooth growth except at the grain boundaries;

The solvent adhering to the grain boundaries can be easily removed;

Removes native oxides and allows good nucleation without the need to dissolve the substrate;

Provides smooth, non-faceted growth independent of grain orientation; and

Enables proper p-type doping to be achieved by adjusting the composition.

The foregoing description of the specific embodiments will so fully reveal the general nature of the invention that others can, by applying current knowledge, readily modify and/or adapt for various applications of such specific embodiments without departing from the generic concept, and, therefore, such adaptations and modifications should and are intended to be encompassed with the meaning and range of equivalence of the disclosed embodiments. It is to be understood that the phraseology or terminology employed herein is for the purpose of description and not of limitation.

What is claimed is:

1. A liquid phase epitaxy method for forming thin crystalline layers of device quality silicon having less than $3 \times 10^{16}$ Cu atoms/cc impurity, comprising:

a) preparing a saturated liquid solution of Si in a Cu/Al solvent at about 20 to about 40 at. % Si at a temperature range of from about 850° C. to about 1100° C. in an inert gas;

b) immersing or partially immersing a multicrystalline silicon substrate in said saturated liquid solution;

c) super saturating the solution melt by lowing the temperature of said saturated solution melt;

d) holding the substrate in the saturated solution melt for a period of time sufficient to cause growing Si to precipitate out of solution and form a crystalline layer of Si on the substrate; and e) withdrawing the substrate from the solution.

2. The method of claim 1, wherein the Si in Cu/Al is present in amounts of about 33.5 at. % Si, and wherein said temperature range is between about 900° C. to about 950° C.

3. The method of claim 1, wherein the inert gas is argon.

4. The method of claim 3, wherein in step c) the temperature is lowered gradually over a period of time in increments of about 0.05° to 0.2° C./min.

5. The method of claim 4, wherein the period of time is from about 1 to about 60 minutes.

6. The process of claim 2 wherein the Cu is present in amounts of about 56.1 at. % Cu, and the Al is present in amounts of about 10.4 at. % Al.

\* \* \* \* \*